(12) United States Patent
Dominizi et al.

(10) Patent No.: US 10,184,978 B2
(45) Date of Patent: Jan. 22, 2019

(54) PROBE CARD AND METHOD FOR PRODUCING A PROBE CARD

(71) Applicant: Infineon Technologies AG, Neubiberg (DE)

(72) Inventors: Karl Dominizi, Altenberg bei Linz (AT); Oliver Frank, Linz (AT); Klaus Standner, Villach (AT); Stefan Zielke, Linz (AT)

(73) Assignee: Infineon Technologies AG, Neubiberg (DE)

( * ) Notice: Subject to any disclaimer, the term of this patent is extended or adjusted under 35 U.S.C. 154(b) by 322 days.

(21) Appl. No.: 14/571,507

(22) Filed: Dec. 16, 2014

(65) Prior Publication Data

US 2015/0168456 A1 Jun. 18, 2015

(30) Foreign Application Priority Data

Dec. 17, 2013 (DE) .................. 10 2013 114 213

(51) Int. Cl.
*G01R 31/28* (2006.01)

(52) U.S. Cl.
CPC .................. *G01R 31/2889* (2013.01)

(58) Field of Classification Search
None
See application file for complete search history.

(56) References Cited

U.S. PATENT DOCUMENTS

| 5,705,932 | A | * | 1/1998 | Fredrickson | ....... | G01R 1/07307 |
| | | | | | | 324/754.08 |
| 7,349,223 | B2 | * | 3/2008 | Haemer | ............. | G01R 1/07314 |
| | | | | | | 29/593 |
| 7,468,610 | B2 | * | 12/2008 | Miyagi | ............... | G01R 31/2889 |
| | | | | | | 324/755.04 |
| 2007/0007977 | A1 | | 1/2007 | Eldridge et al. | | |
| 2008/0122467 | A1 | | 5/2008 | Miyagi et al. | | |
| 2010/0026331 | A1 | * | 2/2010 | Chong | ............... | G01R 1/07342 |
| | | | | | | 324/754.03 |

\* cited by examiner

*Primary Examiner* — Paresh H Patel
(74) *Attorney, Agent, or Firm* — Murphy, Bilak & Homiller, PLLC (57) ABSTRACT

A probe card for a wafer tester includes a mother card having a reinforcing element and at least one daughter card which is rigidly connected to the reinforcing element detachably. The mother card includes electrical contacts for producing an electrical connection with the wafer tester. The at least one daughter card includes electrical contact elements for making contact with an electrical circuit on a wafer. In addition, the mother card and the at least one daughter card are electrically detachably connected to one another via an electrical interface.

21 Claims, 8 Drawing Sheets

PROBE CARD AND METHOD FOR PRODUCING A PROBE CARD

PRIORITY CLAIM

This application claims priority to German Patent Application No. 10 2013 114 213.3, filed on 17 Dec. 2013, the content of said German application incorporated herein by reference in its entirety.

TECHNICAL FIELD

The present invention relates to a probe card for a wafer tester and to a method for producing same.

BACKGROUND

A large number of electronic circuits can be produced on a wafer simultaneously with common method steps. Even before the individual chips are separated, said chips can be tested for their functional reliability on the wafer. Only functionally reliable components are then installed in a housing or encapsulated in a housing.

In order to perform such a test on the wafer, a so-called wafer tester can be used. A probe card is used for matching to the respective circuit to be tested.

A probe card is populated with electronic component parts and, as circuit-specific special manufacture is involved, is expensive to produce. Different contact needle sets for the probe card may be required until an electronic circuit is ready for production as semiconductor chip. Thus, a different needle technology may be used in mass production than in the development phase. In the development phase, it may arise that it is even necessary to make contact with components on a printed circuit in order to test, for example, a test program which is running on the wafer tester.

For these and other reasons, there is a requirement for the present invention.

SUMMARY

According to an embodiment of a probe card for a wafer tester, the probe card comprises: a mother card, which comprises a reinforcing element and at least one daughter card, which is rigidly connected detachably to the reinforcing element. The mother card comprises electrical contacts for producing an electrical connection with the wafer tester. The at least one daughter card comprises electrical contact elements for making contact with an electrical circuit on a wafer. The mother card and the at least one daughter card are electrically detachably connected to one another via an electrical interface.

According to an embodiment of a probe card for a wafer tester, the probe card comprises: a mother card, that comprises electrical contacts for producing an electrical connection to the wafer tester; a daughter card, that comprises electrical contact elements for making contact with an electrical circuit on a wafer; an electrical interface for producing an electrical connection between the mother card and the daughter card; and a planarity element, which couples the daughter card to the mother card parallel and mechanically rigidly.

According to an embodiment of a method for producing a probe card, the method comprises: providing a first soldering frame for positioning discrete connectors on a mother card, wherein the first soldering frame comprises rod-shaped projections, which correspond to those on a daughter card and protrude through through-holes in the mother card; soldering the discrete connectors on the mother card; providing a second soldering frame for positioning the discrete connectors on the daughter card, wherein the second soldering frame comprises through-holes, which correspond to those in the mother card and through which the rod-shaped projections on the daughter card protrude; and soldering the discrete connectors on the daughter card.

Those skilled in the art will recognize additional features and advantages upon reading the following detailed description, and upon viewing the accompanying drawings.

BRIEF DESCRIPTION OF THE DRAWINGS

The attached drawings are intended to enable improved understanding of the exemplary embodiments and form apart of this description. The drawings illustrate exemplary embodiments and, together with the description, help to clarify the principles on which the exemplary embodiments are based. Other exemplary embodiments and many advantages of the exemplary embodiments can therefore be understood better. The elements in the drawings are not necessarily drawn true to scale with respect to one another. Similar reference symbols generally denote similar parts.

Features and/or elements are illustrated with certain dimensions relatively to one another primarily for reasons of clarity and for facilitating understanding. Therefore, relative dimensions in actual implementations may differ from those illustrated herein.

DETAILED DESCRIPTION

Various embodiments including many specific details thereof are set forth in the description below for explanatory purposes and in a manner which is not restrictive by reference to the attached drawings in order to enable detailed understanding of the present invention. It goes without saying that other embodiments which differ in one or more of these specific details can be implemented without departing from the concept of the present invention. Correspondingly, the following description is only intended for illustrative, non-restrictive purposes, and the concept of the present invention is defined by the attached claims.

It also goes without saying that the features of the various exemplary embodiments described herein can be combined with one another where not specifically specified otherwise.

Figure 1:
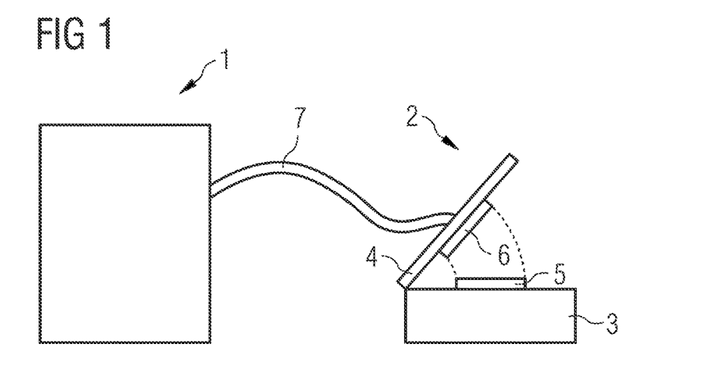
FIG. 1 shows, schematically, a wafer tester comprising a test holder, in which the wafer and the probe card are accommodated.

FIG. 1 shows a wafer tester 1 comprising an accommodating apparatus 2. The accommodating apparatus 2 comprises a base part 3 and a cover 4 mounted pivotably on the base part 3. The base part 3 is provided for holding a wafer 5. The base part 3 can comprise apparatuses (not illustrated) with which the wafer 5 can be positioned precisely, for example by translational shifting or rotary movement. The cover 4 is provided for accommodating a probe card 6. The wafer tester 1 is connected to the cover 4 via a flexible multicore cable 7. The wafer tester 1 and the accommodating apparatus 2 can also have a different embodiment, of course. Thus, the accommodating apparatus does not need to comprise a pivotable cover, for example, and the accommodating apparatus can also be integrated in the wafer tester.

The probe card 6 can have a first surface, which provides electrical contacts, which make it possible to produce an electrical connection with the wafer tester 1 via the cable 7. The probe card 6 can also have electrical contact elements on a second surface, which electrical contact elements come into electrical contact with contact pads on the wafer 5 when the cover 4 is closed. They therefore make contact with the electrical circuit or electrical circuits on the wafer.

The electrical contact elements for making contact with the wafer may be so-called needle elements or contact needles. In the case of the contact needles, it is possible to draw a distinction between cantilever needles, vertical needles and spring-loaded needles. However, other electrical contact elements for making contact with an electrical circuit on a wafer are also possible.

The number of electrical contact elements on the probe card is dependent on the measurement task. It is also dependent on whether only in each case one electrical circuit on a wafer is intended to be measured with a measurement or whether a plurality of electrical circuits, i.e. a plurality of chips, are intended to be measured simultaneously. Since the movement and precise readjustment of the wafer between two measurements can take time and each individual measurement lasts a certain amount of time, the testing of a wafer can be significantly expedited if contact is made simultaneously with a plurality of circuits, or a plurality of chips, or said circuits or chips are measured simultaneously. However, this requires a high number of electrical contact elements.

In probe cards, therefore, more than five hundred electrical contact elements can be provided. Each of the electrical contact elements can in this case make contact with a contact area, a so-called pad, on the wafer. Making contact with a wafer pad means positioning a needle on a flat area. Stringent requirements need to be met for each individual one of the over five hundred contact-making processes. On the one hand, an excessively high positioning pressure can have a destructive effect on the pads on the wafer and can make later bonding to this pad more difficult or even prevent it, for example. On the other hand, an excessively low positioning pressure means that an excessively high contact resistance can at least falsify the measurement and, in the most unfavorable case, the measurement does not take place since no electrical contact is produced at all. This can then result in the corresponding chip being labeled as defective although there was only a contact-making problem of the wafer tester or the probe card.

In particular in the case of a high number of electrical contact elements, therefore, a planarity of the probe card and therefore a planarity of the contact tips is important. Planarity can ensure that the tips of all electrical contact elements lie on one plane. Planarity has the effect that all contact elements can make contact uniformly.

The wafer tester 1 can output different electrical signals. More precisely, a test program which is capable of running on the wafer tester establishes which electrical signals should be present at which outputs and when. In this case, voltage, current, frequency, etc. can be preset. In particular when radiofrequency signals are required in order to test the functionality of the chips on the wafer, particular demands are made of the probe card and the electrical contact elements.

A probe card can have a mother card and a daughter card. The mother card and the daughter card can be electrically detachably connected to one another via an electrical interface. The electrical interface can then likewise be designed for the different electrical signals which are output by the wafer tester 1. In particular, the electrical interface can be designed for radiofrequency signals.

The mother card can have electrical contacts for producing an electrical connection to the wafer tester 1. The electrical contacts can face the cover 4 of the test receptacle 2. The daughter card can have electrical contact elements for making contact with an electrical circuit on a wafer 5. The electrical contact elements of the daughter card point away from the cover 4 and face the wafer 5.

The daughter card can have five hundred or more electrical contact elements. A high number of electrical contact elements can make it possible to measure a plurality of electrical circuits on the wafer, i.e. a plurality of chips on the wafer, simultaneously and parallel to one another, which can save on time during testing.

The mother card can be matched to the respective electrical circuits which are to be tested. The mother card can have electronic components for this purpose.

The daughter card, or more precisely the electrical contact elements on the daughter card, can be matched to the respective wafer to be measured. During the introductory phase or development phase of a new electrical circuit on a wafer, it may be necessary to test the test program running on the wafer tester 1. For this, it may be necessary to simulate the electrical circuit later to be tested. For this purpose, the electrical circuit which will be tested later on a wafer can be realized by discrete components on a printed circuit board. In this case, different electrical contact elements are required for making contact with measurement points on the printed circuit board than are required later for making contact with pads on a wafer. For this purpose, a further daughter card can be provided which has electrical contact elements which are suitable for making contact with measurement points on a printed circuit board. During the test phase of the test program of the wafer tester 1, the mother card can be connected to the further daughter card via the electrical interface. Later in the process, when the test program is functionally reliable and the first wafers are produced, this daughter card can be replaced by a daughter card which has electrical contact elements for making contact with the electrical circuit on a wafer. Further daughter cards can also be provided here. Thus, different electrical contact elements or, to be more precise, different needle technologies may be expedient in the first analysis phase of a new wafer in comparison with the later production phase, in which many identical wafers are tested in mass production.

Figure 2A:
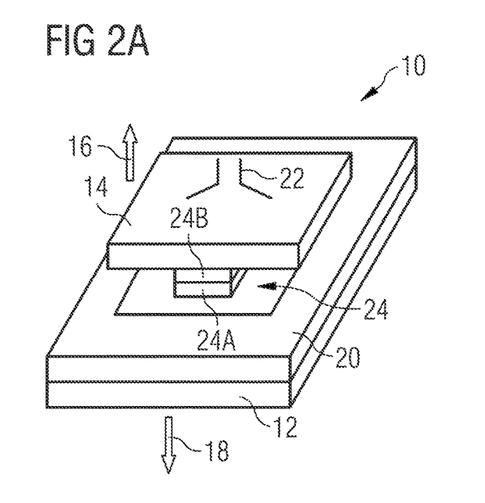
FIG. 2A shows, schematically, in a perspective illustration, a first exemplary embodiment of a probe card.
Figure 2B:
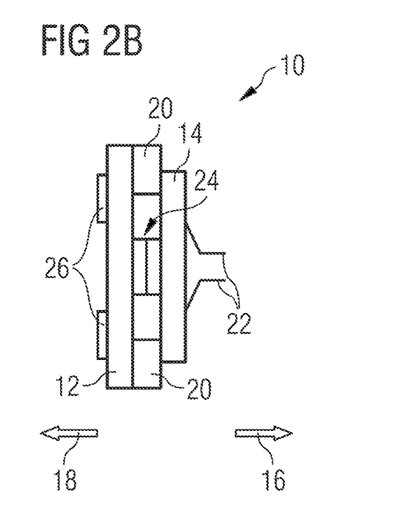
FIG. 2B shows, schematically, a side view of the probe card in accordance with the first exemplary embodiment.

FIGS. 2A and 2B show a first embodiment of a probe card for a wafer tester. FIG. 2A shows a probe card 10, which has a mother card 12 and a daughter card 14. An arrow 16 indicates the direction in which a test object, in particular a wafer to be tested, is located, while an arrow 18 indicates the direction in which a cover of the wafer tester or more generally the contacts of the wafer tester are located. In comparison with FIG. 1, therefore, the probe card 10 is illustrated as being rotated through 180° with respect to the probe card 6 in FIG. 1.

The mother card 12 can be in the form of a printed circuit board (PCB). A printed circuit board is generally slightly elastic. For the case of a probe card, this may be problematic since a very high degree of planarity may be required for the tips of the electrical contact elements which touch the wafer. In particular, planarity may be necessary in which the maximum discrepancy between a highest tip and a lowest tip is below 25 µm. Therefore, the mother card 12 is rigidly connected to a reinforcing element 20. The reinforcing element 20, also referred to by the term "stiffener", can be manufactured from metal. The reinforcing element 20 can be manufactured from steel in particular. In the first exemplary embodiment in FIG. 2A, the reinforcing element 20 is in the form of a frame, which runs substantially along a circumference of the mother card 12. The rigid connection between the mother card 12 and the reinforcing element 20 can be achieved via a screw connection. Other rigid connection possibilities are likewise possible.

The daughter card 14 has electrical contact elements 22, which are indicated merely schematically in FIG. 2A. The electrical contact elements 22 are illustrated as needle elements of the cantilever type. Five hundred electrical contact elements or more can be provided on the daughter card 14. The electrical contact elements 22 can have a different form. The daughter card 14 is rigidly connected to the reinforcing element 20 of the mother card 12. Therefore, the stability and planarity which are imparted by the reinforcing element 20 for the mother card 12 are transferred to the daughter card 14. The rigid connection between the daughter card 14 and the reinforcing element 20 can be ensured via a screw connection. Other rigid connection possibilities which are detachable are likewise conceivable.

An electrical interface 24 connects the mother card 12 and the daughter card 14 electrically to one another. The electrical interface 24 can be formed from a plug-type connection comprising connector jacks 24A and connector pins 24B.

FIG. 2B shows the probe card 10 in accordance with the first embodiment in a side view. An arrow 16 towards the right indicates the side which faces the wafer to be measured. An arrow 18 towards the left indicates the direction in which the contact is made with the wafer tester 1, or in the case of a design as shown in FIG. 1, the cover 4. The mother card 12 is arranged on the left-hand side in FIG. 2B, while the daughter card 14 is arranged on the right-hand side in FIG. 2B. The mother card 12 has electrical contacts 26, which are designed in such away that they can produce an electrical connection to the wafer tester. The daughter card 14 has the electrical contact elements 22, which are designed to make contact with an electrical circuit on a wafer. The reinforcing element 20 is rigidly connected to the mother card 12 and rigidly connected to the daughter card 14. The mother card 12 is electrically connected to the daughter card 14 via the electrical interface 24. The mother card can have electronic components, which are not illustrated in FIG. 2B. The electronic components form an electronic circuit, which matches the electrical signals output by the wafer tester 1 or another wafer tester to the measurement task for the electrical circuit to be measured.

Figure 3:
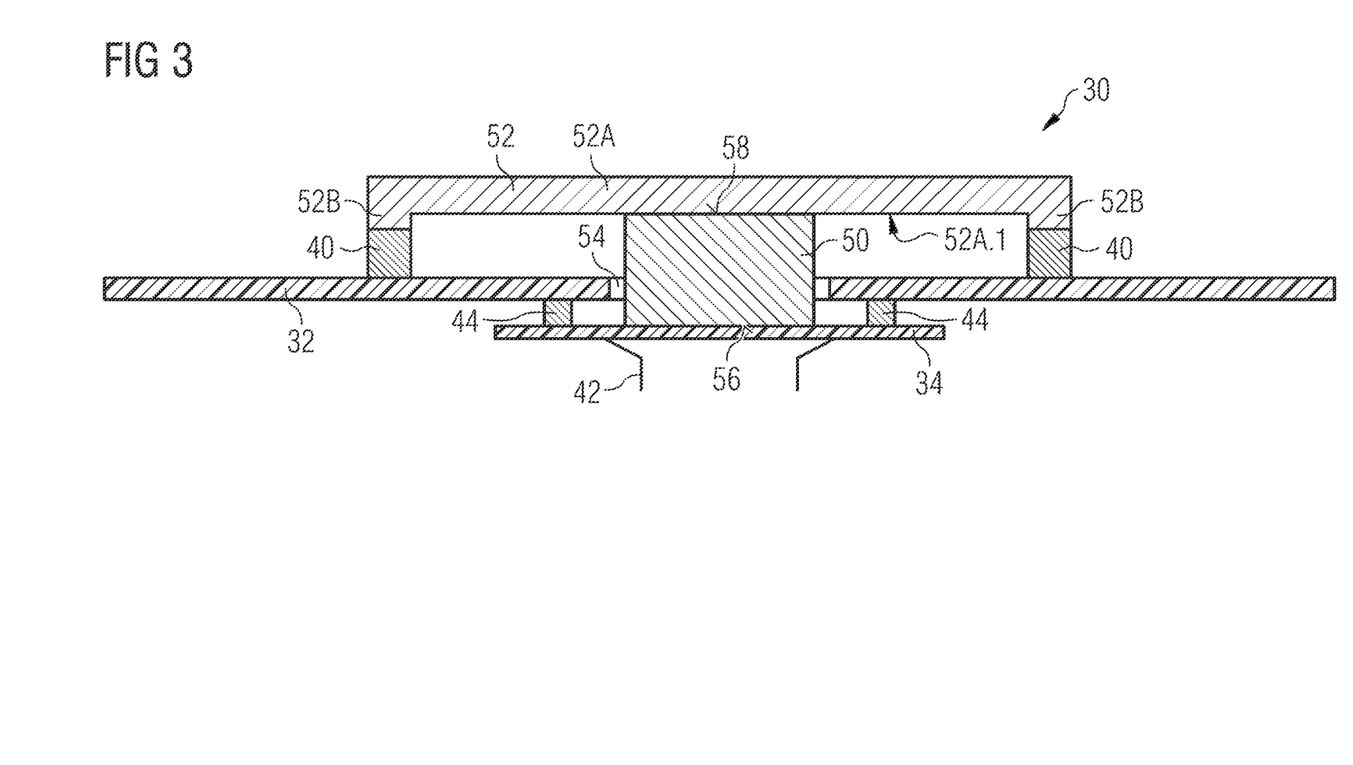
FIG. 3 shows, in a cross section, schematically, a probe card in accordance with a second exemplary embodiment.

FIG. 3 shows, as a second exemplary embodiment, a probe card 30. The probe card 30 comprises a mother card 32 and a daughter card 34. The probe card 30 also comprises an electrical interface 44, a reinforcing element 40, a spacer element 50 and a connecting element 52. Contact-making towards the wafer tester is provided on the side arranged at the top in FIG. 3, while contact-making towards the wafer is provided on the side which is arranged at the bottom in FIG. 3. The daughter card 34 has electrical contact elements 42. The daughter card 34 is electrically connected to the mother card 32 via an electrical interface 44.

The reinforcing element 40 is rigidly connected to the mother card 32 and is located on that side of the mother card 32 which is remote from the daughter card 34. The spacer element 50 is rigidly connected to the daughter card 34. The connecting element 52 is rigidly connected to the reinforcing element 40 and to the spacer element 50. The connecting element 52 connects the spacer element 50 and the reinforcing element 40. Therefore, in the second exemplary embodiment as well, the mother card 32 and the daughter card 34 are rigidly connected to one another. In the second exemplary embodiment, the daughter card 34 is not rigidly connected directly to the reinforcing element 40. In one embodiment, the reinforcing element 40, the spacer element 50 and the connecting element 52 can together be formed in one piece. In a further embodiment, the reinforcing element 40 and the connecting element 52 can be formed in one piece, and the spacer element 50 is fastened rigidly, for example screwed, thereto. In a further embodiment, the spacer element 50 and the connecting element 52 can be formed together in one piece, and the reinforcing element 40 is fastened rigidly, for example screwed, thereto.

The connecting element 52 in accordance with the second exemplary embodiment has a substantially planar part 52A and distancing elements 52B. The substantially planar part has a main surface 52A.1, which defines a plane. The distancing elements 52B protrude out of the plane thus defined. The distancing elements 52B are rigidly connectable to the reinforcing element 40. The distancing elements 52B can be formed in one piece with the reinforcing element 40.

The spacer element 50 can be designed to be solid. For example, the spacer element 50 can be manufactured from a metal. The spacer element 50 can be in the form of a right-parallelepiped or a cylinder, for example. The mother card 32 can be provided with an opening 54, which is matched in terms of its dimensions to the spacer element 50. The spacer element 50 can pass through the mother card 32. The spacer element 50 is passed through the opening 54 in the mother card 32. The spacer element 50 has a first surface 56, which adjoins the daughter card 34. The spacer element 50 has a second surface 58, which is opposite the first surface 56 and which adjoins the connecting element 52. More precisely, the second surface 58 rests on the planar part 52A and on the surface 52A.1 there. The spacer element 50 can be connected with its first surface 56 rigidly to the daughter card 34. The first surface 56 can have threaded bores for this purpose. The spacer element 50 can be connected with its second surface 58 rigidly to the connecting element 52. The second surface 58 can have threaded bores for this purpose.

When the spacer element 50 is in the form of a cylinder, the first surface 56 is formed by a first end face of the cylinder and the second surface 58 is formed by a second end face of the cylinder. The second end face of the cylinder can have threaded bores, which enable screwing to the planar part 52A of the connecting element 52.

The solid design of the spacer element 50 makes it possible to transfer the stability and planarity obtained owing to the reinforcing element 40 for the mother card 32 to the daughter card 34. In particular, the spacer element 50 can be arranged centrally with respect to the electrical contact elements 42 of the daughter card in order to ensure the planarity in particular in the region of the needle tips. The spacer element 50 or the cylinder 50 can have a diameter which is between approximately 35 mm and approximately 45 mm, in particular between approximately 37 mm and approximately 43 mm. If the spacer element 50 is in the form of a right-parallelepiped, it can have edge lengths along the first surface and the second surface of the same order to magnitude, i.e. edge lengths between approximately 35 mm and approximately 45 mm.

The spacer element 50 can have a height which is between approximately 20 mm and approximately 30 mm. The height can in particular be between approximately 23 mm and approximately 27 mm. The height of the spacer element 50 is dependent on the thickness of the mother card 32, the height of the distancing element 52B, the height of the electrical interface 44 and the height or thickness of the reinforcing element 40. The height of the spacer element 50 can be calculated as the sum of the height of the electrical interface 44, the thickness of the mother card 32, the thickness of the reinforcing element 40 at the point at which the distancing elements 52B adjoin the reinforcing element 40, and the height of the distancing elements 52B.

In the case of the probe card 30 in accordance with the second embodiment, the spacer element 50 is rigidly connected to the daughter card 34, the spacer element 50 is rigidly connected to the connecting element 52, the connecting element 52 is rigidly connected to the reinforcing element 40, and the reinforcing element 40 is rigidly connected to the mother card 32. It goes without saying that rigidly connected is not equivalent in meaning to inseparably connected. All of these connections can be detachable.

Figure 4:
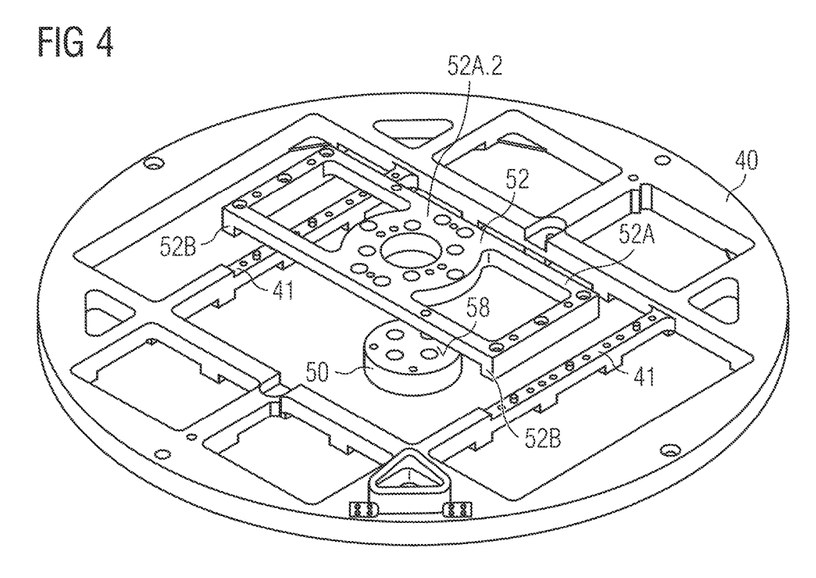
FIG. 4 shows, in a perspective illustration, mechanical parts of the probe card in accordance with the second embodiment.

FIG. 4 shows a perspective illustration of the reinforcing element 40, the spacer element 50 and the connecting element 52 in accordance with the second embodiment. In the illustration in FIG. 4, the mother card and the daughter card are not illustrated. FIG. 4 illustrates only those elements which affect the stability of the probe card 30 in such a way that a high degree of planarity of the needle tips of the electrical contact elements is ensured. The spacer element 50 is in the form of a cylinder. That surface 58 of the spacer element 50 which is at the top in FIG. 4 is provided with bores, which enable a rigid connection to the connecting element 52. The bores can be threaded bores.

The reinforcing element 40 has a number of openings or notches which are matched to the mother card. Electronic components can be arranged on the mother card and/or contact areas which produce the electrical connection to the wafer tester can be arranged, in both cases in the openings in the reinforcing element 40. In particular, the electronic components can be located within the large central opening in the reinforcing element 40, and the contact areas can lie below the six outer rectangular panels.

The connecting element 52 has the substantially planar part 52A. The connecting element 52 also has through-openings, which enable access to the mother card from above. A substantially ring-shaped region 52A.2 is formed in the planar part 52A, which substantially ring-shaped region 52A.2 is matched to the spacer element 50 and enables the rigid connection between the spacer element 50 and the connecting element 52. In addition, the connecting element 52 has the distancing elements 52B, which can also be referred to as feet. These distancing elements 52B can be rigidly connected to webs 41 of the reinforcing element 40, for example via a screw connection.

Figure 5:
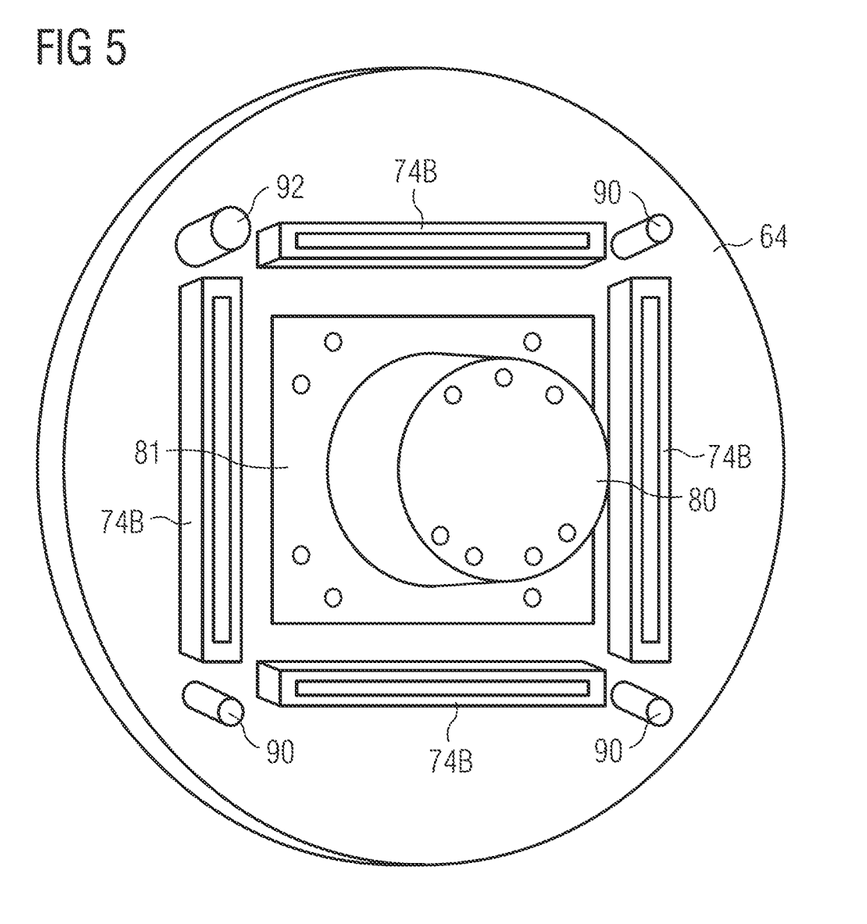
FIG. 5 shows a perspective view of a daughter card in accordance with a third embodiment.

FIG. 5 shows a perspective view of a daughter card in accordance with a third embodiment. FIG. 5 shows that side of a daughter card 64 which faces the mother card illustrated in FIG. 6. Electrical contact elements for making contact with a wafer are arranged on that side of the daughter card which is not visible in FIG. 5. The daughter card 64 is rigidly connected to a spacer element 80. The daughter card 64 also has three rod-shaped projections 90 and a rod-shaped projection 92. The daughter card 64 furthermore comprises, for example, four discrete connectors 74B, which form part of an electrical interface 74 to the mother card.

The spacer element 80 has a cylinder, which is connected to a substantially rectangular plate 81, which forms a flange, with which the cylinder 80 can be connected with a first end face rigidly to the daughter card 64. The second end face of the cylinder 80, which is at the front in FIG. 5, is provided with threaded bores, which enable a screw connection to a connecting element. The rod-shaped projections 90 and 92 can be in the form of adjusting pins. The rod-shaped projection 92 has a greater diameter than the rod-shaped projections 90. Position coding can thus be achieved. This means that a mother card which is provided with corresponding through-holes can only be positioned in one orientation. In addition, the adjusting pins ensure that parts 74A of the electrical interface which are arranged on the corresponding mother card are precisely opposite the parts 74B of the electrical interface on the daughter card, with the result that simple connection between the connector pins and the connector jacks is possible.

The spacer element 80 is positioned centrally between the discrete connectors 74B. Each of the discrete connectors 74B can have at least one hundred electrical contacts. The use of discrete connectors has the advantage that very narrow spacings between the individual connector pins/connector jacks can be provided and nevertheless good electrical properties, such as high dielectric strength, good radiofrequency response and high electrical conductivity, for example, can be achieved. The electrical contacts of the discrete connectors 74B are electrically connected to the electrical contact elements which can make contact with a wafer on the rear side of the daughter card.

The discrete connectors 74B lie substantially along the side edges of a square, while the rod-shaped projections 90, 92 are arranged substantially in the corners of this square.

Figure 6:
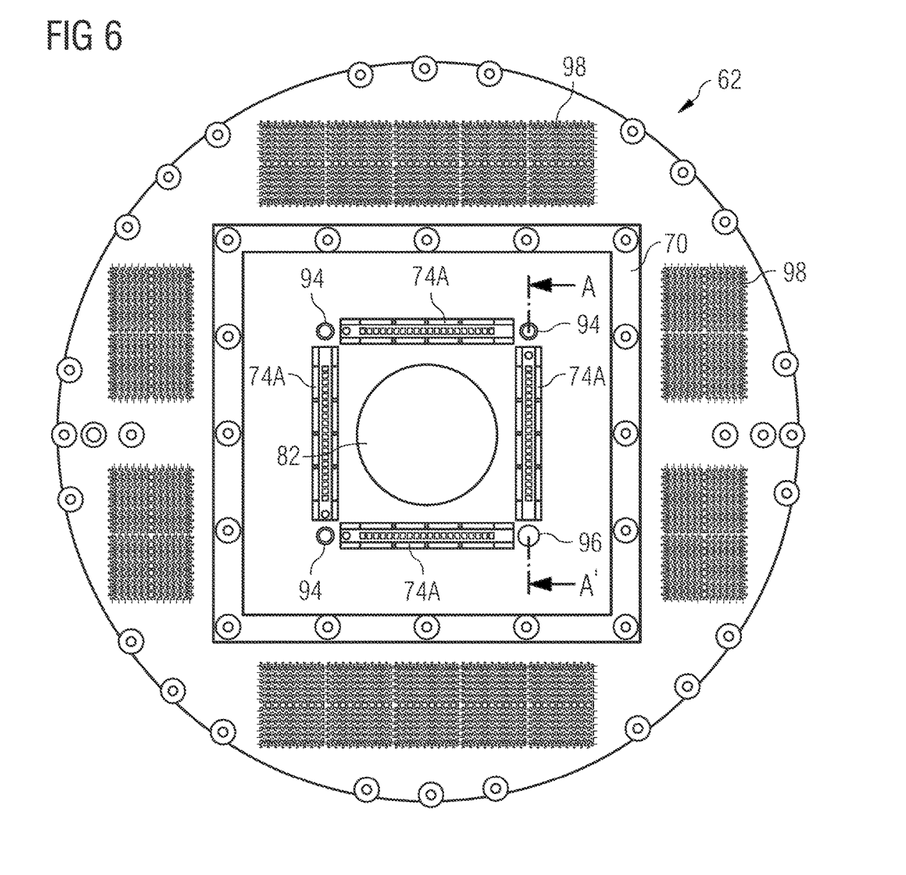
FIG. 6 shows a plan view of a mother card in accordance with the third embodiment.

FIG. 6 shows a plan view of a mother card 62, which, together with the daughter card 64 shown in FIG. 5, can form a probe card. The mother card 62 has a reinforcing element 70, which is in the form of a frame. An opening 82 in the mother card 62 is located within the frame 70. The opening 82 is matched to the size of the spacer element 80. The opening 82 is circular. It has a diameter which is equal to or slightly greater than the diameter of the cylinder 80. If the daughter card 64 and the mother card 62 are plugged together, the spacer element 80 protrudes through the opening 82.

The mother card 62 also has, for example, four connectors 74A. The plan view of the mother card 62 shows the side facing the wafer tester or the cover 4 of the test receptacle 2 shown in FIG. 1. The soldered contacts of the connectors of the mother card which protrude out of the opposite side (the side not shown in FIG. 6) of the mother card are denoted by the reference symbol 74A. The connectors 74A, together with the connectors 74B, form the electrical interface between the daughter card 64 and the mother card 62. The connectors 74A are arranged substantially along the edges of a square, as already explained with reference to FIG. 5 for the connectors 74B of the daughter card 64. The arrangement of the connectors 74A on the mother card 62 is matched to the arrangement of the connectors 74B on the daughter card 64. Through-bores 94 and 96, which are matched to the rod-shaped projections 90 and 92, respectively, are provided between the connectors on the corner points of the square. That is to say that the hole 96 or the bore 96 is larger than the bores 94 since the rod-shaped projection 92 protrudes through the bore 96 when the daughter card 64 and the mother card 62 are assembled. The mother card 62 also has contact area panels 98, which form electrical contacts to the wafer tester.

The daughter card 64 and the mother card 62 are substantially circular. They are therefore matched to the shape of the test object, of the wafer, which is generally likewise substantially circular. In another example, the daughter card 64 and/or the mother card 62 can also be angular. In addition, it should be noted that the reinforcing element 70 of the third embodiment can also have a similar embodiment to the reinforcing element in the second embodiment. A reinforcing element which additionally also supports the outer rim of the mother card, such as the reinforcing element 40, ensures additional stability. The reinforcing element can also have a shape other than that illustrated in the embodiments, which imparts stability to the mother card and the daughter card.

Figure 7A:
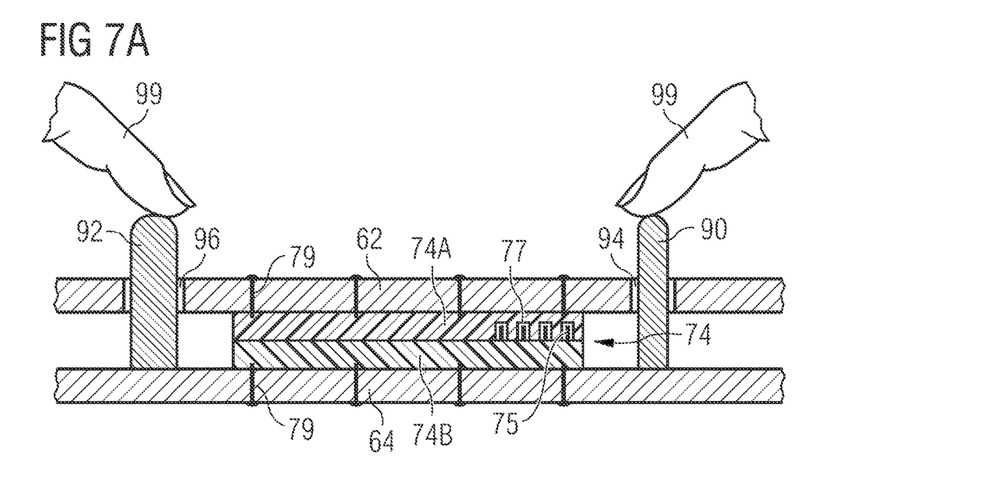
FIGS. 7A and 7B each show a sectional illustration along a line A-A' in FIG. 6 with daughter card positioned.
Figure 7B:
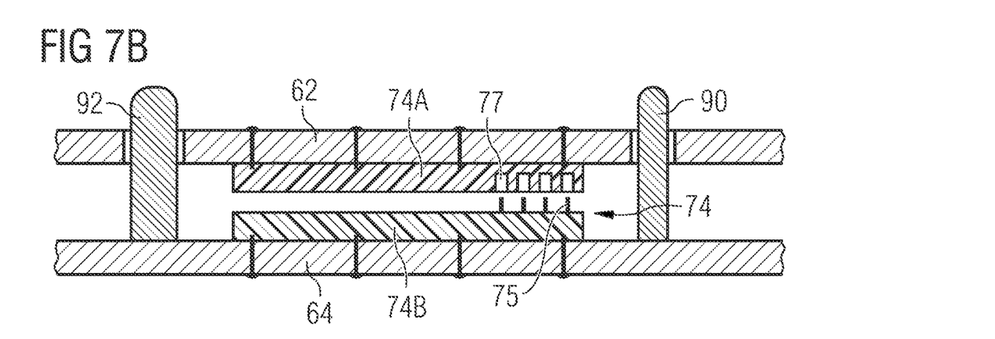

FIGS. 7A and 7B show a section along the line A-A' in FIG. 6. In FIG. 7A, the electrical interface 74 is closed, while it is open in FIG. 7B. The electrical interface 74, when it is embodied with discrete connectors, can have a height which is between approximately 4 mm and approximately 10 mm. In particular, it can be between approximately 5 mm and approximately 7 mm.

FIG. 7A shows the daughter card 64 with a connector 74B, which has contact pins 75. The mother card 62 has a connector 74A, which contains jacks 77. The connectors 74A and 74B can be plugged through the daughter card and the mother card, respectively, and soldered on the respective rear side, as indicated schematically by vias 79. These are the soldering points that can be seen in FIG. 6. In each case only a few contact pins 75 and a few jacks 77 are illustrated by way of example. A connector 74 can have in each case more than one hundred contact pins or contact jacks, which can be arranged in a plurality of rows.

FIG. 7A shows the plugged state, i.e. the electrical contact pins 75 are accommodated in the jacks 77 and provide electrical contact. The rod-shaped projections 90 and 92 protrude through the mother card 62 into the bores 94 and 96. The rod-shaped projections are embodied so as to be so long that they protrude to a marked extent. The rod-shaped projections can have a length which is between approximately 25 mm and approximately 35 mm.

In order to detach the connection between the mother card 62 and daughter card 64, the protruding rod-shaped projections 90 and 92 can be used as separation aids. FIG. 7A shows that the user of the wafer tester can use his fingers 99 to press on the rod-shaped projections 90, 92 while at the same time being able to hold the reinforcing element 70 of the mother card, for example (not illustrated). If several hundred contact pins of discrete connectors are accommodated in corresponding contact jacks of discrete connectors, considerable forces need to be applied for detachment. At the same time, the detachment should take place cleanly upwards. This is assisted by the guidance by the rod-shaped projections 90, 92 in the holes 94, 96.

FIG. 7B shows the state after successful separation. The pins 75 are no longer in the jacks 77 and the daughter card 64 and the mother card 62 are separated from one another. The rod-shaped projections 90 and 92 continue to protrude slightly beyond the mother card 62. The rod-shaped projections 90 and 92 have a length which at least corresponds to the thickness of the mother card added to a minimum height of the electrical interface, when said electrical interface is separated. As a result, rod-shaped projections 90 and 92, as just described, can be used as separation aid.

MIS connectors, for example, can be used as connectors for the mother card 62. The corresponding mating connectors for the daughter card 64 can be MIT connectors. Each of the MIS/MIT connectors 74A and 74B, respectively, has 152 contacts, for example. Thus, the probe card of the third exemplary embodiment has in total 608 contacts, for example, if the mentioned connectors are used. In this case, a common grounding pin is included. The connectors can be used up to a frequency of approximately 8.5 GHz, for example. The connectors can conduct a current of up to approximately 1.6 A, for example. The connectors have an internal metal plate for grounding. The spacing between two adjacent contacts is approximately 0.635 mm, for example. The use of discrete connectors with such a design having such a small contact spacing enables a daughter card/mother card concept even in the case of a very high number of contacts. Connectors with such a contact density can be very difficult to separate and should be adjusted with respect to one another carefully during positioning. Precise assembly can be ensured with the rod-shaped projections 90, 92 and the mating holes 94 and 96. The adjusting aids 90 and 92, which are embodied to be extended, also enable separation of the connectors without any damage, and without a tool needing to be used as an aid.

Figure 8:
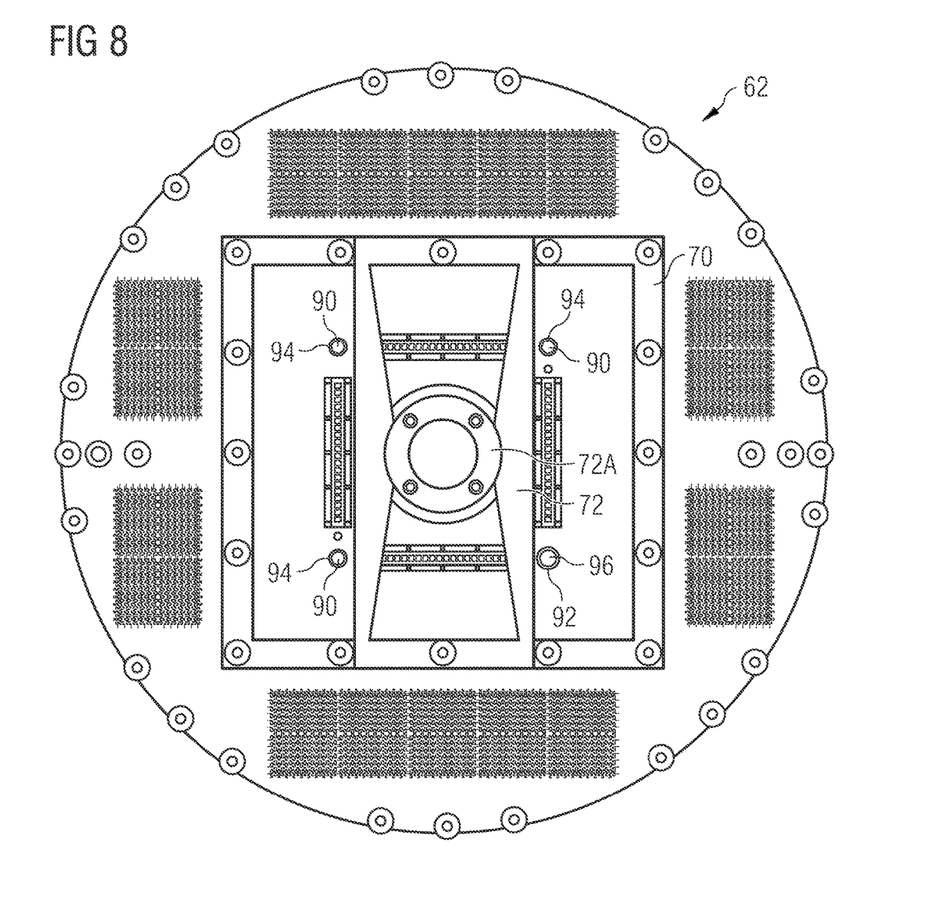
FIG. 8 shows a plan view of the mother card in accordance with the third exemplary embodiment with the connecting element positioned.

FIG. 8 shows a plan view of the mother card 62 of the third embodiment. The daughter card 64 (not shown in FIG. 8) is hidden, and a connecting element 72 is rigidly connected to the frame-shaped reinforcing element 70. The connecting element 72 has a substantially ring-shaped region 72A, to which the cylinder 80 (not shown in FIG. 8) is screwed with an end side. The daughter card is therefore rigidly coupled to the mother card. The connecting element 72 has cutouts, which enable access to the contacts on the mother card from the depicted side. The rod-shaped projections 90 and 92 protrude through the openings 94 and 96.

Figure 9:
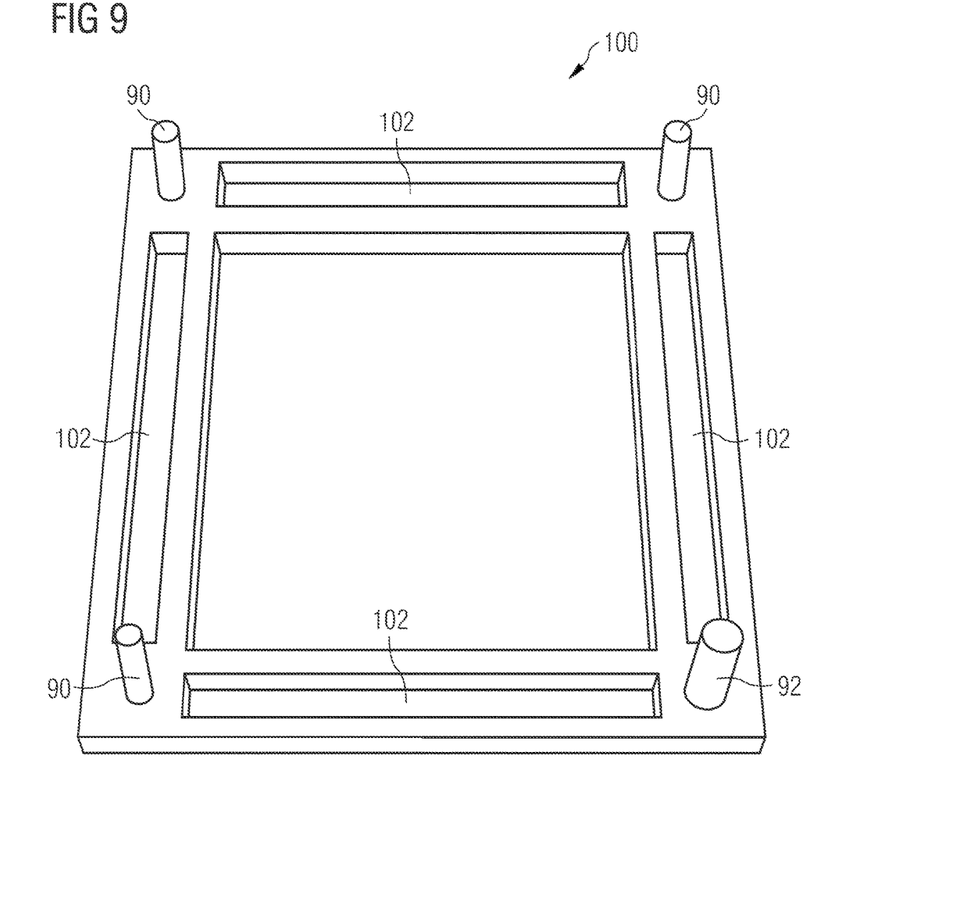
FIG. 9 shows, in a perspective view, a first soldering frame for positioning discrete connectors on the mother card in accordance with the third exemplary embodiment.

A method for producing a probe card, such as, for example, in accordance with exemplary embodiments 1 to 3, will be explained with reference to FIG. 9. As already explained with reference to FIGS. 7A and 7B, the discrete connectors 74A, 74B used have a high number of poles and damage-free plugging requires precise positioning of the connectors with respect to one another. The connectors should therefore be positioned precisely during manufacture of the mother card and the daughter card. In order to achieve precise positioning of the connectors on the mother card, a soldering frame 100, as illustrated generally in FIG. 9, is provided. The soldering frame 100 is used for positioning the discrete connectors on the mother card. The soldering frame 100 has rod-shaped projections 90, 92. The same reference symbols have been used as in FIG. 5 for the rod-shaped projections of the daughter card. The rod-shaped projections of the soldering frame 100 are used in place of the rod-shaped projections of the daughter card. The soldering frame 100 can therefore be plugged onto the mother card using the bores 94 and 96. The soldering frame 100 has cutouts 102, which are matched to the discrete connectors 74A to be positioned. The connectors 74A can be positioned and soldered precisely with the aid of the soldering frame 100.

In order to produce a probe card, a second soldering frame (not illustrated here) is required for the daughter card. It is similar to the soldering frame 100 but has through-holes corresponding to the holes 94, 96 at the locations of the rod-shaped projections 90, 92. The soldering frame (not illustrated) for the daughter card can therefore be plugged onto the rod-shaped projections of the daughter card. Otherwise, the soldering frame (not illustrated) likewise has cutouts 102, which are matched to the connectors of the daughter card 74B.

It should be noted that a second daughter card with different electrical contact elements, with which a discretely designed circuit can be measured, for example, instead of a wafer, can have the same planarity element or spacer element in the form of a cylinder or a right-parallelepiped as the daughter cards discussed in relation to the exemplary embodiments. This second daughter card can also have the same connectors as part of an electrical interface to the mother card as the described daughter cards. The further daughter card can differ from the daughter card described here in detail only in terms of the shape of the electrical contact elements. It can be used instead of the daughter card described and can be connected to the mother card in the same way. Then, a plurality of daughter cards are assigned to a mother card, which daughter cards can be plugged as required without modification of the mother card being necessary. Thus, the costly mother card does not need to be manufactured a plurality of times, but only a plurality of daughter cards are required.

In one example, a probe card for a wafer tester can have a mother card and a daughter card. The mother card can have electronic component parts, and the daughter card can have electrical contact elements for making contact with an electrical circuit. An interface for detachably connecting the mother card and the daughter card can be provided. The exemplary probe card can also have a reinforcing element, which is rigidly connected to the mother card. A spacer element can be rigidly connected to the daughter card, wherein the reinforcing element and the spacer element are rigidly connected to one another when the daughter card is connected to the mother card.

In one example, a probe card can have a spacer element, which is substantially a cylinder, which adjoins a daughter card with a first end face. The spacer element can have a fastening flange, which is coplanar with respect to the first end face and is used for fastening the spacer element to the daughter card.

As used herein, to the extent to which expressions such as "contain", "have", "having", or variants thereof are used either in the detailed description or in the claims are to be understood is that such expressions should be inclusive in a way similar to the expressions "comprise", "have". The expression "by way of example" is intended merely to denote an example instead of the best or optimum example in accordance with any given criterion.

Although a specific feature or a specific aspect of an embodiment of the invention may have been disclosed with respect to only one of several implementations, such a feature or such an aspect can be combined with one or more other features or aspects of the other implementations, as may be desirable and advantageous for an arbitrary given or specific application.

Although specific embodiments have been illustrated and described herein, a person skilled in the art will understand that many modifications can be performed, adaptations can be carried out and variants can be implemented in respect of the specific embodiments shown and described without departing from the concept of the present invention. Accordingly, all such modifications, adaptations and variations of the specific embodiments explained herein are intended to be covered, and the invention is only restricted by the concept of the claims.

What is claimed is:

1. A probe card for a wafer tester, the probe card comprising:
    a mother card configured to interface with the wafer tester;
    a daughter card configured to interface with a wafer via electrical contact elements;
    an electrical interface configured to electrically connect the daughter card to the mother card;
    a reinforcing element rigidly connected to the mother card at a side of the mother card which is remote from the daughter card;
    a spacer element rigidly connected to the daughter card; and
    a connecting element rigidly connected to the reinforcing element and to the spacer element,
    wherein the mother card is separated from the connecting element by the reinforcing element,
    wherein the daughter card is separated from the reinforcing element by the mother card,
    wherein the connecting element connects the spacer element and the reinforcing element so that the mother card and the daughter card are rigidly connected to one another,
    wherein the spacer element is configured to transfer stability and planarity obtained owing to the reinforcing element for the mother card to the daughter card,
    wherein the daughter card is not rigidly connected directly to the reinforcing element.

2. The probe card of claim 1, wherein the reinforcing element, the spacer element and the connecting element are formed in one piece.

3. The probe card of claim 1, wherein the reinforcing element and the connecting element are formed in one piece, and wherein the spacer element is fastened rigidly to the one piece.

4. The probe card of claim 1, wherein the spacer element and the connecting element are formed in one piece, and wherein the reinforcing element is fastened rigidly to the one piece.

5. The probe card of claim 1, wherein the connecting element comprises a substantially planar part and a plurality of distancing elements, wherein the substantially planar part has a main surface which defines a plane, wherein the distancing elements protrude out of the plane, and wherein the distancing elements are rigidly connectable to the reinforcing element.

6. The probe card of claim 5, wherein a height of the spacer element corresponds to a sum of the height of the electrical interface, the thickness of the mother card, the thickness of the reinforcing element at a point at which the distancing elements adjoin the reinforcing element, and the height of the distancing elements.

7. The probe card of claim 5, wherein a substantially ring-shaped region is formed in the substantially planar part of the connecting element, wherein the substantially ring-shaped region is matched to the spacer element and enables a rigid connection between the spacer element and the connecting element.

8. The probe card of claim 5, wherein the distancing elements are rigidly connected to webs of the reinforcing element.

9. The probe card of claim 1, wherein the spacer element is in the form of a right-parallelepiped or a cylinder.

10. The probe card of claim 1, wherein the spacer element has a first surface which adjoins the daughter card and a second surface opposite the first surface and which adjoins the connecting element.

11. The probe card of claim 10, wherein the second surface of the spacer element contacts a substantially planar part of the connecting element, and wherein the first surface of the spacer element contacts the daughter card.

12. The probe card of claim 11, wherein the first surface of the spacer element has first threaded bores configured to rigidly connect the spacer element at the first surface to the daughter card, and wherein the second surface of the spacer element has second threaded bores configured to rigidly connect the spacer element at the second surface to the connecting element.

13. The probe card of claim 11, wherein the spacer element is in the form of a cylinder, wherein the first surface of the spacer element is formed by a first end face of the cylinder, wherein the second surface of the spacer elements formed by a second end face of the cylinder, and wherein the second end face of the cylinder has threaded bores configured to enable screwing to the planar part of the connecting element.

14. The probe card of claim 1, wherein the spacer element is arranged centrally with respect to the electrical contact elements of the daughter card.

15. The probe card of claim 1, wherein the spacer element is rigidly connected at a first end to the daughter card and rigidly connected at a second end opposite the first end to the connecting element, wherein the connecting element is rigidly connected to the reinforcing element, and wherein the reinforcing element is rigidly connected to the mother card.

16. The probe card of claim 15, wherein all of the rigid connections are detachable.

17. The probe card of claim 1, wherein the daughter card comprises a plurality of rod-shaped projections, wherein at least one of the rod-shaped projection has a different diameter than the other rod-shaped projections to provide position coding, and wherein the mother card comprises through-holes that correspond to the diameters of the rod-shaped projections so that the mother card can be positioned in only one orientation with respect to the daughter card.

18. The probe card of claim 17, wherein the spacer element is positioned centrally between the first discrete connectors.

19. The probe card of claim 17, wherein the first discrete connectors lie substantially along side edges of a square, and wherein the rod-shaped projections are arranged substantially in corners of the square.

20. The probe card of claim 1, wherein the daughter card comprises a plurality of first discrete connectors which form part of the electrical interface, wherein the mother card comprises a plurality of second discrete connectors which form part of the electrical interface, and wherein the plurality of first discrete connectors is matched to the plurality of second discrete connectors.

21. The probe card of claim 1, wherein the mother card comprises a reinforcing element in the form of a frame, wherein an opening in the mother card is located within the frame, and wherein the spacer element is configured to protrude through the opening in the frame when the daughter card and the mother card are plugged together.

* * * * *

UNITED STATES PATENT AND TRADEMARK OFFICE
CERTIFICATE OF CORRECTION

PATENT NO.         : 10,184,978 B2
APPLICATION NO.    : 14/571507
DATED              : January 22, 2019
INVENTOR(S)        : Dominizi et al.

Page 1 of 1

It is certified that error appears in the above-identified patent and that said Letters Patent is hereby corrected as shown below:

In the Claims

Column 13, Line 24 (Claim 13) please change "spacer elements" to -- spacer element is --
Column 14, Line 8 (Claim 17) please change "projection has" to -- projections has --

Signed and Sealed this
Ninth Day of April, 2019

Andrei Iancu
*Director of the United States Patent and Trademark Office*